Sept. 1, 1970 D. L. PELTZER 3,526,541

ELECTRICALLY CONDUCTIVE THIN FILM CONTACTS

Filed Dec. 23, 1966 2 Sheets-Sheet 1

INVENTOR.
DOUGLAS L. PELTZER
BY
Samuel E. Turner
ATTORNEY

United States Patent Office 3,526,541
Patented Sept. 1, 1970

3,526,541

ELECTRICALLY CONDUCTIVE THIN FILM CONTACTS

Douglas L. Peltzer, Cupertino, Calif., assignor to General Electric Company, a corporation of New York Filed Dec. 23, 1966, Ser. No. 604,409
Int. Cl. H01v *11/12;* H01r *9/04*
U.S. Cl. 117—212 7 Claims

ABSTRACT OF THE DISCLOSURE

A process for making an electrically and mechanically reliable contact between a first thin film conductor which has been exposed to a contaminating atmosphere and a second, subsequentially formed, thin film conductor by intermediately forming therebetween a thin metallic film of material which has substantial solid solubility in the material of the first thin film conductor and is from the group consisting of endium and bismuth. Heat from the subsequent formation of the second thin film conductor, or from a specific heat source, causes the formation of a eutectic alloy at the contaminated interface between the first thin film conductor and the intermediate thin metallic film.

This invenion relates to thin-film devices and particularly to the fabrication of reliable electrically conductive joints or contacts between conductive thin films.

In the interest of miniaturization and economy, numerous electrical and electronic devices are now fabricated in thin-film form. Several methods are known for forming such thin films including deposition by evaporation, sputtering, and electroplating.

Among the circuits that advantageously may be fabricated in thin-film form are the cryoelectric or superconductive circuits and the present invention, although not limited thereto, will be described for purposes of illustration, in connection with the fabrication of such circuits.

According to a known process for forming thin-film superconductive circuits an insulating substrate is placed in a chamber which can be evacuated. Alternate layers of conductive and insulating materials are then deposited on the substrate by evaporation, the vapors of the evaporated material striking the substrate through the openings of pattern defining masks placed adjacent the substrate to form the circuit configuration.

Typically it is necessary to form electrically conductive contacts between various of the conductive layers at several local areas. Vacuum deposition apparatus has been developed with provision for changing masks and material sources so that circuit assembly can be fabricated without removal from the evacuated atmosphere. In this case, adequate layer-to-layer contacts can usually be formed simply by depositing the second thin film directly upon the desired contact areas of the first film because the first film suffers little oxidization or other surface contamination in the evacuated atmosphere.

There is a practical limitation to the complexity and size of a thin-film circuit assembly that can be fabricated by the deposition-through-masks technique. Complex masks are not only expensive to produce but they are flimsy and fragile and large masks tend to warp, thereby causing variable shadowing, that is irregular conductor edges, with consequent variability of thin-film device characteristics.

To overcome the limitations of the deposition-through-masks technique, a photoetching process for fabricating thin films is disclosed by John W. Bremer in U.S. patent application Ser. No. 536,558, filed Mar. 9, 1966, entitled Cryogenic Circuit Fabrication, and assigned to the assignee of the present invention. In accordance with the process therein disclosed each conductive layer may be formed into the desired circuit configuration by first depositing (for example, by evaporation in vacuum) a continuous thin-film layer and selectively removing the thin-film material by a photoetching process to provide the desired circuit configuration.

As most practically carried out, the photoetching process involves the removal of the substrate and partially fabricated circuit assembly from the evacuated atmosphere whereby the thin-film areas destined for contact with subsequently deposited thin-film layers are normally subjected to corrosive environments. The usual result is the formation of a surface tarnish over these areas (including oxides, sulfides, carbonates and other corrosion products) which prevent or interfer with the making of reliable electrical contact with the subsequently deposited thin-film layers.

It has been proposed to protect the contact areas from contamination by maintaining the assembly in an inert atmosphere. Such an approach is complicated, unhandy and of limited practicability.

Another approach which has been proposed is the removal of the contamination by the use of a vapor flux such as by directing a stream of hydrogen ions over the contact areas after the assembly has been returned to the vacuum chamber. While this approach has been somewhat successful, additional expensive equipment is required in the vacuum chamber and additional pumping time is required to remove the gases before subsequent film deposition can proceed.

Liquid fluxes have been found impractical because they remove an undue amount of the very thin films involved and they leave an active residue which is very difficult completely to remove.

Attempts have been made to form reliable thin-film contacts by raising the temperature of the films at the contact areas, the theory being that when the metals of the film became molten the contamination film would be broken up and the metals would amalgamate. It was found that temperatures sufficient to achieve this result destroyed the integrity of the films.

It is the object of the present invention to provide a simple, effective method of forming reliable electrical contacts between conductive thin films.

It is a specific object of the invention to produce superconductive contacts between superconductive thin films.

These and other objects are achieved in accordance with the invention by placing an intermediate film of a different metal between the thin films of the circuits at the contact areas. A metal for this intermediate film is selected which has substantial solid solubility in the metal of thin film which has acquired the surface contamination whereby the intermediate metal will penetrate and break up the contaminating film. A metal different from the metals of the thin-film circuits is selected so that a low-melting-temperature alloy is formed at the interface of the circuit films.

In some cases the fabrication process, such as evaporation deposition, provides sufficient heating of the materials to cause the necessary diffusion of the intermediate metal into the metals of the contacting films. In other cases it may be desirable to stimulate this diffusion by heating at least the contact areas after all of the film layers have been deposited.

It is well known that a eutectic alloy of two or more metals has a lower melting temperature than any one of the parent metals. Thus the thickness of the intermediate film is limited to the minimum necessary to disrupt the contaminating film and form reliable contact. In this manner, the amount of the intermediate metal is insufficient to form a low-melting-temperature alloy with all of the circuit film metal of the contact areas which could cause low-temperature melting of the contacts and severance from the circuit conductors.

The invention will be described more specifically in the following detailed description of an example of the application of the invention with reference to the accompanying drawing in which.

Figure 1:
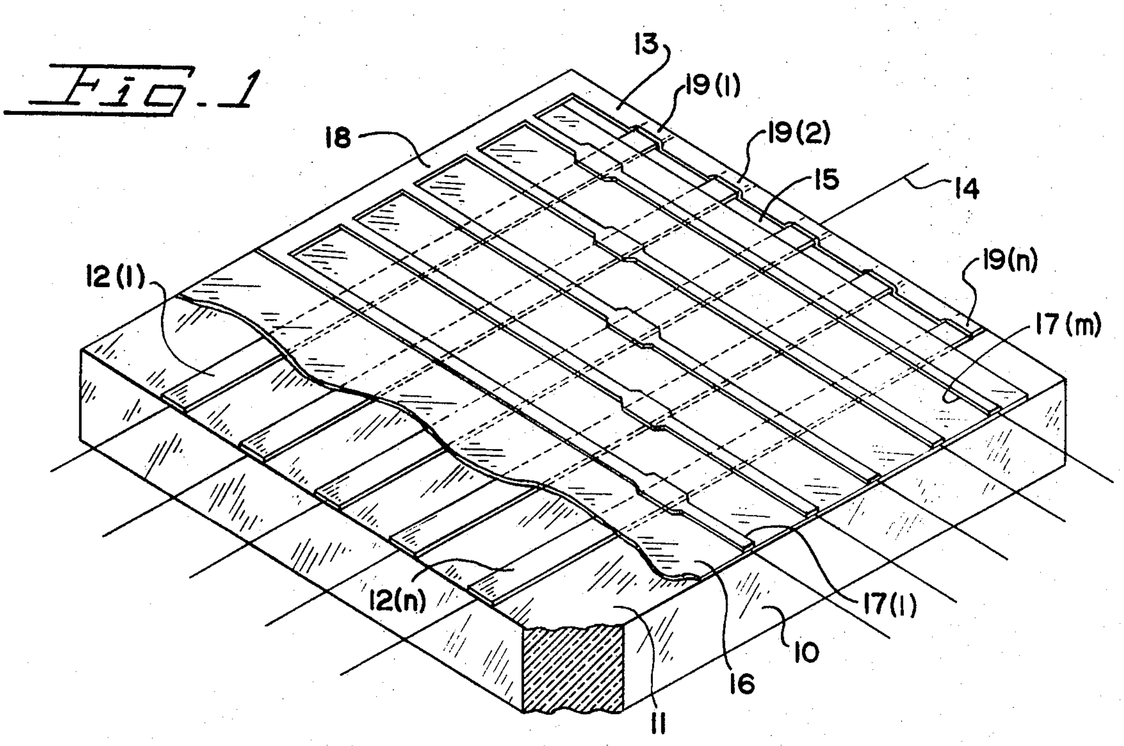
FIG. 1 is a perspective view illustrating an example of a thin-film circuit assembly.

Shown in FIG. 1 is a superconductive matrix which is presented as an example of a multiple-layer thin-film circuit assembly for the purpose of illustrating the application of the method of the invention to the formation of reliable inter-film contacts.

While such a switch is a relatively simple thin-film circuit, it will serve to illustrate how the method of forming inter-film contacts of the present invention may be applied to more complex circuits such as a thin-film form of the circuits shown by J. W. Bremer, et al., in U.S. Pat. No. 3,167,748, issued July 5, 1962, entitled Cryotron Memory, and assigned to the assignee of the present invention.

Operation of the switching matrix of FIG. 1 is based upon the phenomenon of superconductivity. Certain electrical conductors are known to exhibit a loss of electrical resistance at supercold temperatures approaching absolute zero and to regain resistance in the presence of a certain "critical" magnetic field. The critical field depends upon the particular superconductive material as well as its temperature. Superconductive materials requiring comparatively high critical magnetic fields are known as "hard" superconductors while those requiring comparatively low critical magnetic fields are known as "soft" superconductors.

Superconductors can be used to form a cryotron or superconductive switch. In the preferred thin-film form the cryotron comprises a gate conductor film in the order of 0.3–1.0 micron thickness of soft superconductive material which is crossed by a narrow control conductor film also in the order of 0.3–1.0 micron thickness insulated therefrom and preferably formed of hard superconductive material. Both the gate conductor and the control conductor are thus normally in the superconducting state. If sufficient current is caused to flow through the control conductor the resulting magnetic field causes the gate conductor to become resistive in the region of the crossover.

More detailed information on superconductive devices is presented by John W. Bremer in "Superconductive Devices," McGraw-Hill Book Company, Inc., New York, 1962.

The construction and operation of the switching matrix of FIG. 1 is briefly as follows. A substrate for supporting the thin-film circuitry comprises a suitable base 10 having an insulating film or surface 11. Formed on the insulating surface 11 is a plurality of thin strips of soft superconductive material such as tin which form a plurality of gate conductors 12(1)–**12(*n*). A film of insulating material 16 is formed over the gate conductors and over the substrate except for a strip 15** which is left uncovered to expose the ends of the gate conductors.

Formed over the insulating film 16 is a plurality of strips of hard superconductive material such as lead which form a plurality of control conductors 17(1)–**17(*m*). The control conductors are connected together at one end by a strip 18. A strip 13, which is preferably continuous with strip 18, makes electrical contact with the ends of the gate conductors 12(1)–12(*n*), at a plurality of contact areas 19(1)–19(*n*), and with a common lead 14**.

When a current of sufficient magnitude is caused to flow in a selected control conductor, the resulting magnetic field causes the gate conductors to become resistive except for the one gate conductor beneath the wide segment of the control conductor. For example, if control conductor 17(1) is selected, all of the gate conductors become resistive except gate conductor **12(*n*)**.

To provide high-density and complex circuitry it is desirable to employ a photoetching method to produce the conductive thin-film circuit patterns. Such a method is described in the previously-mentioned copending patent application Ser. No. 536,558.

Figure 2:
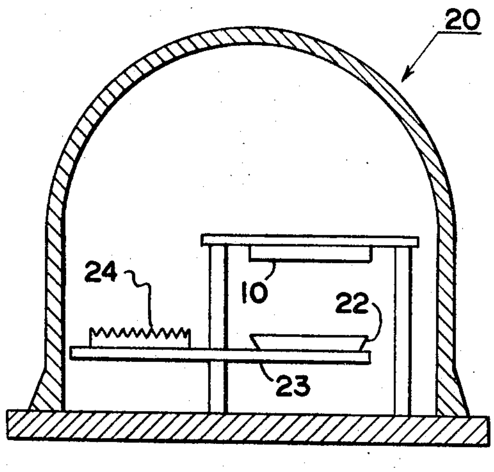
FIG. 2 is a general illustration of evaporation apparatus.

To fabricate the switching matrix of FIG. 1 by the photo-etching method, for example, the process is outlined briefly as follows:

The insulating substrate 10 is placed in a film evaporating apparatus indicated generally as 20 in FIG. 2. The chamber is evacuated (by means not shown) and a material such as tin is evaporated from a boat 22 to form a thin film (in the order of 0.3–1.0 micron) from which the gate conductors 12(1)–**12(*n*) are to be formed. (The boat 22 may be mounted on a turntable 23 so that boats of other material and other processing equipment may be rotated into position beneath the substrate 10** without breaking the chamber vacuum.)

The substrate 10, now bearing the deposited thin tin film may be removed from the apparatus 20 and subjected to a photoetching process similar to that set forth in the above-mentioned patent application Ser. No. 536,558 to form the pattern of gate conductors 12(1)–**12(*n*)** of the circuit assembly of FIG. 1. A suitable tin thin-film etching solution is formed, for example, by 30 cc. of concentrated nitric acid (70 percent $HNO_3$), 10 cc. concentrated hydrochloric acid (37 percent HCl) and 150 cc. of distilled water at a temperature of about 30 degrees centigrade. For a tin film of 6,000 angstroms the etching time is about 5 seconds.

After the pattern of gate conductors 12(1)–**12(*n*) is formed, the substrate 10 is replaced in the evaporating apparatus 20. After the chamber has been evavuated, insulating material such as silicon monoxide is evaporated through a mask (not shown) so that an insulating film 16 is formed over the gate conductors 12(1)–12(*n*) except for the right-hand ends thereof, which provide the contact areas 19(1)–19(*n*)**.

A material such as lead is now evaporated over the foregoing materials to form a thin film (in the order of 0.3–1.0 micron) from which the control conductors 17(1)–**17(*m*) and the connecting strips 13 and 18 are to be formed. The substrate 10 is then removed from the apparatus 20 and subjected to a photoetching process as set forth in the above-mentioned application Ser. No. 536,558 to form the pattern of control conductors 17(1)–17(*m*) and connecting strips 13 and 18, it being noted that the connecting strip 13 has been formed directly over the ends of the gate conductors 12(1)–12(*n*) at the contact areas 19(1)–19(*n*)**.

It has been found that the process outlined above does not provide reliable (or superconducting) contacts between the gate conductors 12(1)–**12(*n*) and the connecting strip 13 at the contact areas 19(1)–19(*n*) because of a contaminating surface film formed on the tin gate conductors 12(1)–12(*n*) during the removal of the substrate 10 from the vacuum chamber and the photoetching process of forming the gate conductors 12(1)–12(*n*)**.

Attempts to remove this surface contamination with liquid fluxes were unsuccessful because of destruction of the thin films and inability completely to remove undesirable residues.

This surface contamination has been successfully removed by the in-vacuum bombardment of the contact areas with a vapour flux such as hydrogen ions. However, the required apparatus is expensive and complicated and significant time is required for removal of the products of this operation from the vacuum chamber before processing can proceed. Also, for very thin films an undesirable amount of the film material is removed.

Attempts have been made to fuse the contact metals simply by the application of heat to the contact areas. It was found that when heat, sufficient to melt the tin and break up the contaminating film was applied, the metals at the contacting areas formed globules thus severing the conductors of the thin-film conductive pattern.

In accordance with the present invention the problem of reliable contacts between thin-metal films is solved in a simple, straightforward manner that requires little addition time and equipment and that is fully compatible with the vacuum deposition process. This is accomplished by depositing a thin film of a different metal, at least at the contact areas, intermediate the thin films between which contact is desired.

More specifically, the process outlined above for fabricating the circuit assembly of FIG. 1 is modified in accordance with the invention by depositing a thin film of an intermediate metal at least over the contact areas 19(1)–**19(*n*) after the insulating film 16 has been deposited and before deposition of the tin thin film for forming the contacting strips 13 and 18 and control conductors 17(1)–17(*m*)**.

Figure 3:
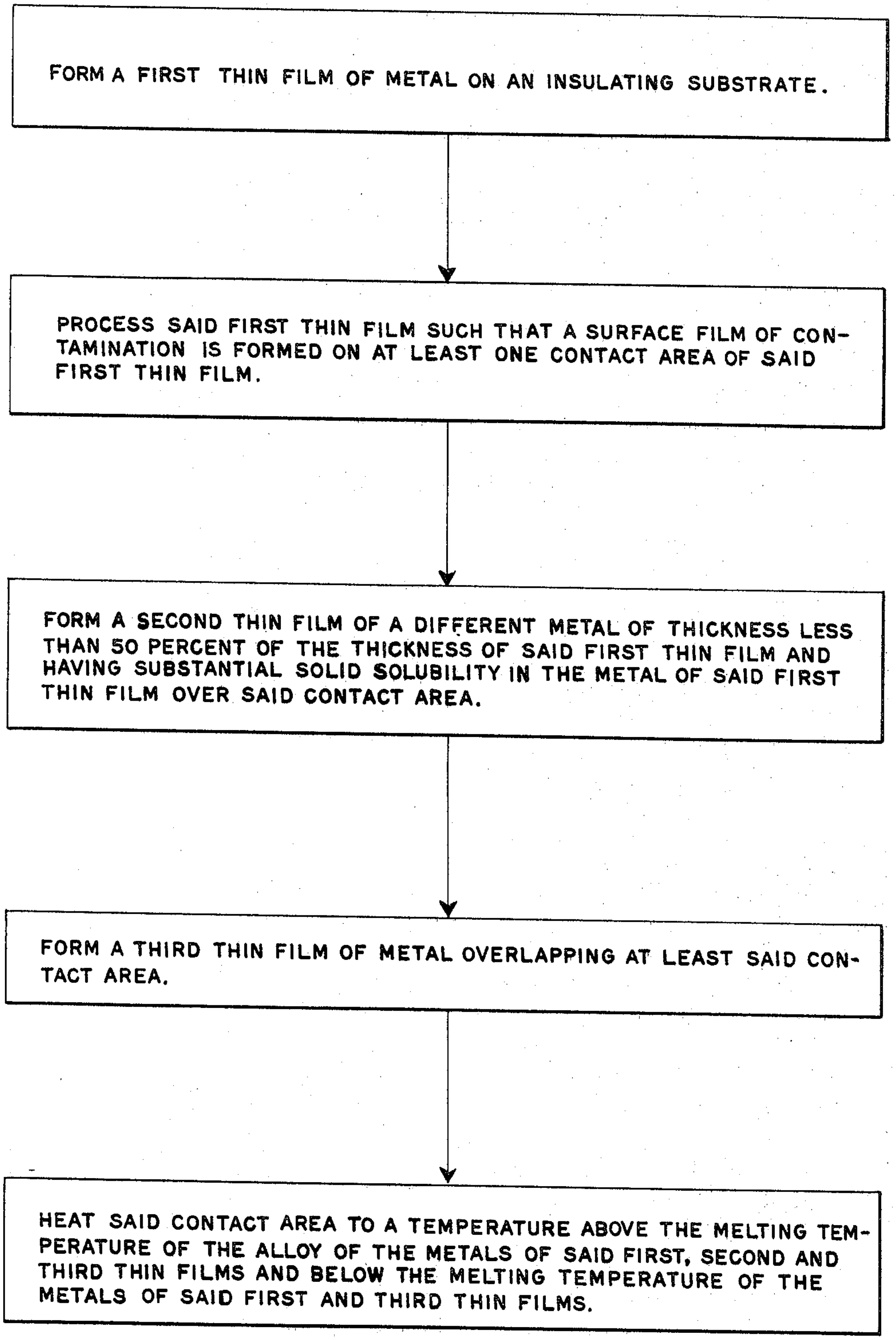
FIG. 3 is a diagram of the steps of the process of fabricating the inter-film contacts of the circuit assembly of FIG. 1 according to the present invention.

For some combination of metals the heat of deposition is sufficient to cause diffusion of the metal of the intermediate film through the contamination into the underlying metal film. In other cases it is desirable to provide additional heat. For this purpose the turntable 23 (FIG. 2) can be rotated to bring a heater 24 in position to heat the assembly to a temperature above the eutectic temperature of the alloy of the contacting metals but below the melting temperatures of the contacting films or their alloys. This process of forming thin-film contacts in accordance with the invention is outlined in FIG. 3.

Selection of an appropriate metal for forming the intermediate film is based on the following considerations: To achieve the required diffusion through the contaminating film, the metal forming the intermediate film should have substantial solid solubility in the metal of the film having the contaminated surface. Factors governing solid solubility are set forth by Albert G. Guy at p. 143 of "Elements of Physical Metallurgy," Addison-Wesley Publishing Company, 2nd ed., Reading, Mass., 1960. Briefly, the sizes of the two metallic atoms should differ by less than 15 percent, chemical affinity of the two metals should be minimum, the metal of the intermediate film should have the higher valence, the metals should have a similar type of crystal structure. Guy points out that these are general rules to which there are numerous exceptions. For contacting films of tin and lead, bismuth and indium are favorable metals for the intermediate film.

The thickness of the intermediate film should be limited to avoid the formation of a low-melting-temperature alloy with all of the metal of the contacting films which could cause low temperature melting of the contacts and severance from the circuit conductors. Thus, the thickness of the intermediate film is advantageously limited to no more than 50 percent of the thickness of the contacting film of least thickness. It is found that reliable contacts can be achieved with very thin intermediate films—in the order of 5–10 percent of the thickness of the contacting films. For example, for contacting tin and lead films of 6,000 and 10,000 angstroms, respectively, an intermediate film of bismuth of a few hundred angstroms is sufficient to achieve reliable superconductive contacts. Thus by limiting the thickness of the intermediate film a low-melting-temperature alloy bond is formed at the interface of the contacting films.

Thus what has been described is a simple, inexpensive and compatible method of forming reliable electrical contacts between thin metal films.

While the principles of the invention have been made clear in the illustrative embodiments, there will be obvious to those skilled in the art, many modifications in structure, arrangement, proportions, the elements, materials and components used in the practice of the invention, and otherwise, which are adapted for specific environments and operating requirements, without departing from these principles. The appended claims are, therefore, intended to cover and embrace any such modifications within the limits only of the true spirit and scope of the invention.

What is claimed is:

1. A method of fabricating on an insulating substrate a thin-film superconductive circuit assembly having at least two conductive layers generally insulated one from the other and making superconductive contact in at least one predetermined limited area, comprising the steps of: forming on said substrate a first thin film of first superconductive material; forming a thin film of insulating material over said first superconductive material excluding said limited area; forming a second thin film of a metal selected from the group of bismuth and indium over at least said limited area; and forming a third thin film of second superconductive material over said foregoing materials including said limited area.

2. The method defined by claim 1 including the further step of heating at least said limited area to a temperature above the eutectic temperature of the alloy of the materials of said first, second and third thin films and below the melting temperature of the material of either of said first and third thin films and their alloys.

3. The method defined by claim 1 wherein said first superconductive material is tin.

4. A method of fabricating on an insulating substrate a thin film circuit assembly having at least two electrically conductive films overlapping and making conductive contact in at least one predetermined area, comprising the steps of: forming on said substrate a first thin film of a first conductive material; forming a second thin film of a second conductive material selected from the group consisting of bismuth and indium over at least said predetermined area without having first removed any accumulated contamination from said area, said second conductive material having substantial solid solubility in said first conductive material; and forming on said substrate a third thin film of conductive material overlapping said predetermined area.

5. The method defined by claim 4 wherein the thickness of said second thin film is less than 50 percent of the thickness of said first thin film.

6. The method of claim 5 including the further step of heating at least said predetermined area to a temperature above the eutectic temperature of the alloy of said first and second conductive materials and below the melting temperature of either of said first and third conductive materials and their alloys.

7. A method of fabricting on an insulating substrate a thin film circuit assembly having at least two electrically conductive films overlapping and making conductive contact in at least one predetermined area, comprising the steps of: placing said substrate in an evacuated atmosphere; depositing by evaporation on said substrate a first thin film of metal; exposing said first thin film to a contaminating atmosphere; returning said substrate to an evacuated atmosphere; depositing by evaporation over at least said predetermined area of said first thin film a second thin film of a different metal having substantial solid solubility in the metal of said first thin film without having removed any accumulated contaminants from said area; and depositing by evaporation on said contaminated substrate a third thin film of metal overlapping said predetermined area.

References Cited

UNITED STATES PATENTS

| | | | |
|---|---|---|---|
| 3,395,040 | 7/1968 | Pritchard et al. | 117—212 |
| 3,391,024 | 7/1968 | Pierce | 117—107 X |

ALFRED L. LEAVITT, Primary Examiner

A. GRIMALDI, Assistant Examiner

U.S. Cl. X.R.

29—630, 599; 117—217; 317—234